United States Patent [19]

Volk et al.

[11] Patent Number: 4,701,135

[45] Date of Patent: Oct. 20, 1987

[54] HIGH DENSITY CONNECTOR FOR MAIN FRAMES IN TELEPHONE SYSTEMS

[75] Inventors: Thomas G. Volk, Highland Park; Donald F. Jaycox, Deerfield, both of Ill.

[73] Assignee: Northern Telecom Limited, Montreal, Canada

[21] Appl. No.: 863,510

[22] Filed: May 15, 1986

Related U.S. Application Data

[63] Continuation-in-part of Ser. No. 785,733, Oct. 9, 1985, abandoned.

[51] Int. Cl.[4] .............................................. H05K 7/14
[52] U.S. Cl. .................................... 439/54; 439/922; 379/327
[58] Field of Search ................. 339/18 R, 18 B, 18 C, 339/18 P, 198 R, 198 P, 198 S, 150 B, 151 B, 119 R, 125 R; 179/98; 361/428; 379/327

[56] References Cited

U.S. PATENT DOCUMENTS 3,199,068  8/1965  Neenan ........................... 339/198 S
3,760,328  9/1973  Georgopulos ..................... 339/18 R

FOREIGN PATENT DOCUMENTS 55-127788  10/1980  Japan ................................. 178/98

Primary Examiner—Neil Abrams
Attorney, Agent, or Firm—Schwartz, Jeffery, Schwaab, Mack, Blumenthal & Evans

[57] ABSTRACT

A connector for mounting on a vertical main frame has an elongate body portion containing a protector field and an elongate jumper field extending along one side. The connector is mounted on the frame member by a bracket which mounts the connector so that the body portion extends at an angle to the plane of the main frame. With an appropriate angle, a useful space is provided between connectors, for access, while removal and replacement of protector modules, and entire connectors, is readily available. One particularly appropriate angle is about 53°, while another is about 70°, although these can vary. A test field can also extend along one side, adjacent to the jumper field.

53 Claims, 19 Drawing Figures

HIGH DENSITY CONNECTOR FOR MAIN FRAMES IN TELEPHONE SYSTEMS

CROSS REFERENCE

This application is a continuation-in-part application of Ser. No. 785,733, filed Oct. 9, 1985, now abandoned.

BACKGROUND OF THE INVENTION

1. Field of the Invention

This invention relates to connectors for mounting on main frames in central offices of telephone systems, and similar systems, and is particularly concerned with providing a high density connector arrangement which has easy access to the protector field and jumper field. A test facility can be provided by the use of front testpoint modules, for example, or by a test field positioned adjacent to the jumper field.

2. Related Art

Main frames in central offices and the like have vertical frame members spaced at 8 inch pitch, the frame members generally extending vertically for about eight feet. A vertical row of connectors is mounted on each frame member. A constant objective is to obtain the maximum density of connections, and terminating eight hundred pairs per vertical is desirable. Connectors generally form two basic types—what are referred to as front facing and side facing. In side facing connectors, the protector modules face sideways and are removed in a sideways movement. A problem arises in that there is often insufficient room to remove the protector modules readily when the connector size is large enough to provide the desired density. In front facing connectors, the protector modules face forward and are easy to remove, but again, with connectors sized to provide the desired density, there is very little space between connectors to get an arm through for feeding conductors without sacrificing vertical spacings.

The present invention provides a connector adapted for mounting on a frame member such that, while extending in a vertical plane, the plane of the connector is inclined whereby the connector extends from the frame member at an angle to the plane of the main frame. The protector field has both a forward and a sideways facing orientation. By mounting the connectors at an angle, the lateral width is reduced and sufficient space is provided between connectors for an installer to insert his arms. Also, because of the angle, the installer's arm and hand is readily directed toward the jumper wire routing ring through which he must place the jumper wire. The overall height of a connector is 11 inches, with one hundred pair terminations. Therefore, eight hundred pair termination is obtained in eight feet. A protector module can be readily removed and replaced. The removal and replacement of a connector can be carried out with minimal hindrance from another connector. Thus the invention provides a connector having a high density, with a somewhat front facing appearance on the module field.

OBJECTS AND SUMMARY OF THE INVENTION

In its broadest aspect, the invention provides a connector for mounting on a vertical frame member, the connector having an elongate rectangular main body portion of shallow rectangular cross-section viewed along the vertical axis, the body portion having a plurality of positions for mounting of protector modules, the positions being in columns and rows. At one side of the body portion there is provided a jumper field having a plurality of jumper connecting terminals. The terminals are in rows and columns. At the side of the body portion remote from the jumper field there may be provided a forward extending flange. A separate test field can be provided immediately adjacent to the jumper field. The invention also provides a main frame connector installation or arrangement comprising a plurality of connectors mounted to provide the density and access advantages above recited.

In a preferred embodiment, the protector positions extend in rows of five positions, with twenty rows providing one hundred positions or one hundred pair terminations. Each position has five terminals composed of a ground terminal and two pairs of line terminals. In the jumper field, there are 20 rows of jumper terminals, each row comprising five pairs of terminals. One pair of jumper terminals is associated with one pair of line terminals at a protector position and the relationship of jumper terminals and protector terminals is readily ascertained. The connector is held on the frame member by a bracket at the desired angle. One particularly convenient angle has been found to be about 53°, although this may be varied slightly, for example by 2° or 3°, i.e. between about 50° and 56°, to give a usable clearance or gap between adjacent connectors, in one example about 3½ inches. Another convenient angle is about 70°, giving a gap of about 3¾ to 4 inches. The overall height of a connector is about 11 inches. Where a test field is provided adjacent to the jumper field, the test positions or terminals are arranged in columns and rows and are readily related to the protectors.

BRIEF DESCRIPTION OF THE DRAWINGS

The invention will be readily understood by the following description of certain embodiments, by way of example, in conjunction with the accompanying diagrammatic drawings, in which.

DETAILED DESCRIPTION OF THE DRAWINGS

Figure 1:
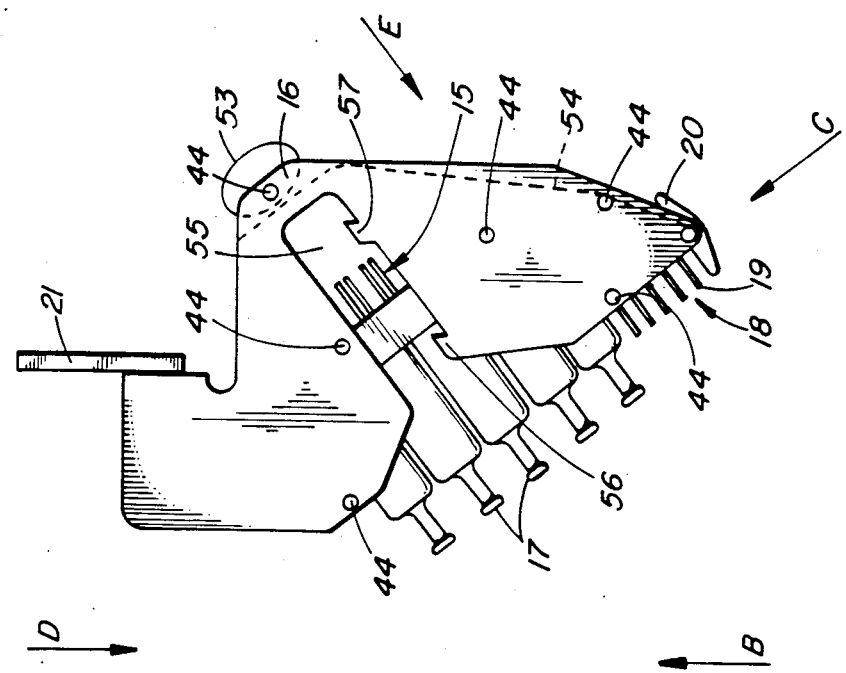
FIG. 1 is a top plan view, illustrating two connectors and support bracket mounted in accordance with one embodiment of the present invention.
Figure 1:
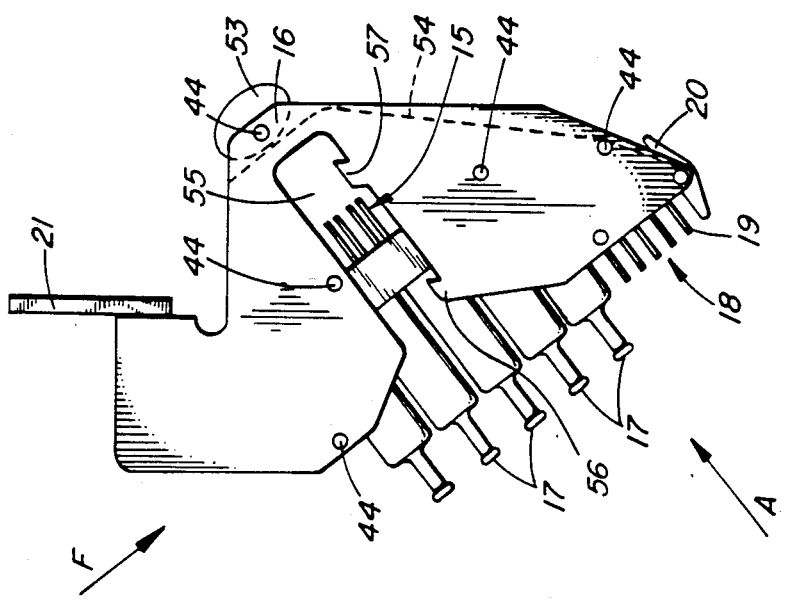

FIG. 1 is a top plan view of two connectors 15 side by side in accordance with one embodiment or arrangement of the present invention. The upper end of a mounting bracket 16 is seen. Protector modules 17 are positioned in the protector field of the connector and the jumper field is indicated generally at 18, with jumper connector terminals having their front ends extending at 19. Adjacent to the jumper terminals is a fanning strip or member 20. The jumper field extends forward of the main body portion of the connector. The frame members are indicated at 21.

Figure 2:
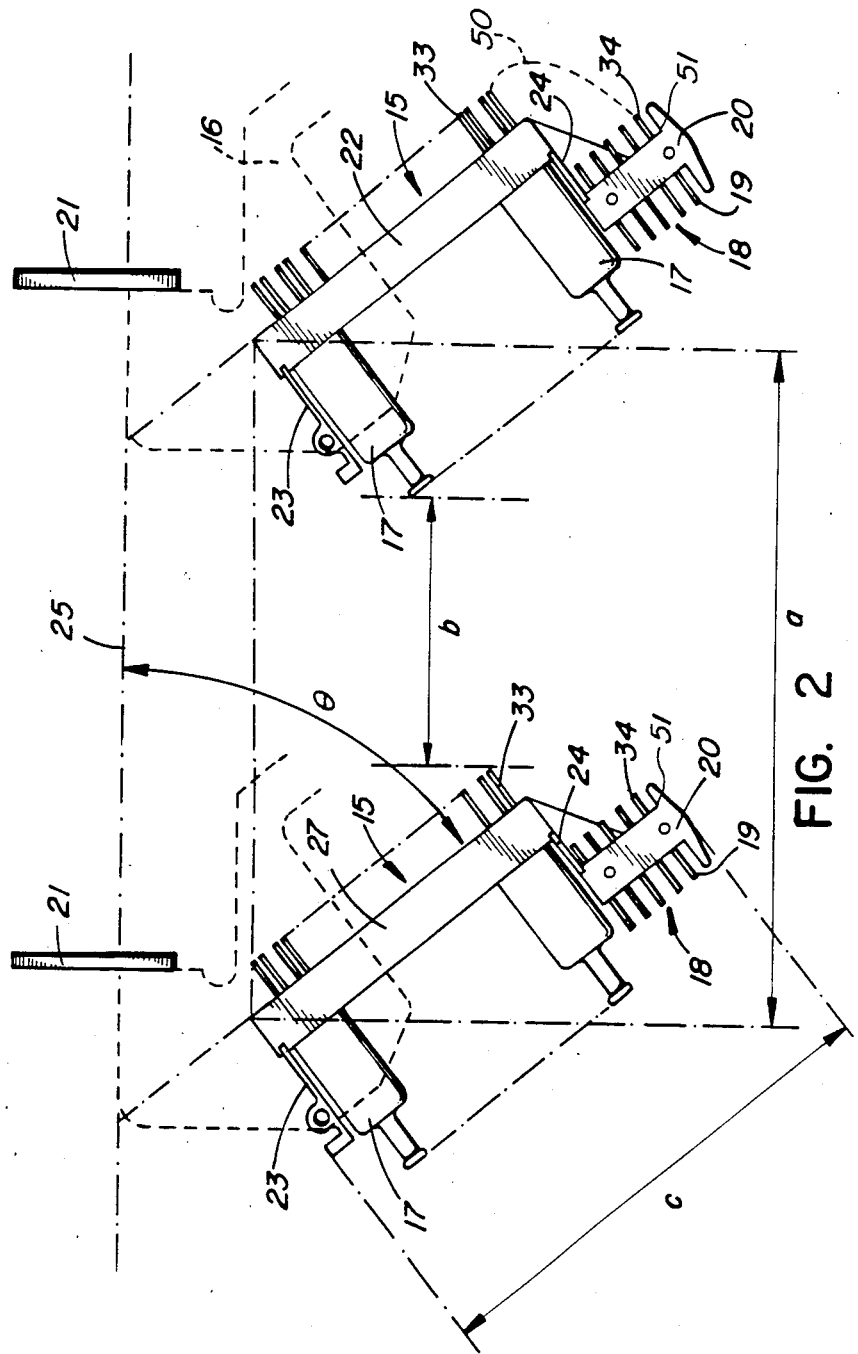
FIG. 2 is a top plan view of two connectors as in FIG. 1 with the top part of the support bracket omitted.

FIG. 2 illustrates the basic arrangement of the connectors and, particularly, illustrates the relative positioning of one connector 15 mounted on one frame member 21, relative to another connector 15 mounted on the next adjacent frame member 21. Indicated on FIG. 2 are some parameters of the connector mounting. Thus, the distance between centers, "a"—which corresponds to the pitch of the frame members 21—is eight inches. The clearance between adjacent connectors, with protector modules 17 in position—dimension "b"—is approximately 3½ inches with the angle θ being about 51° and about 3¼ inches with the angle about 53°. This is for connectors having an overall width "c" of 6 inches. It will be seen that protector modules 17 can be removed in a substantially straight line and without any difficulty. The overall length of the protector modules 17 will also affect the dimension "b". There is little or no substantial overlap of connectors when viewed directly on the front face of a connector. Angle θ is the angle between the plane of the main body portion 22 and the plane of the main frame, indicated by chain dotted line 25.

It will be seen in FIG. 2, that in the particular example illustrated the connector has an elongate rectangular main body portion 22, the jumper field 18 and the fanning strip or member 20 being a separate member. A forward projecting rib 23 extends along the side of the protector field remote from the jumper field. A shield member 24 extends between the jumper field 18 and the main body portion 22. The rib 23 extends forward, in the example, substantially the same distance as does the jumper field 18. The main body portion 22 extends between the rib 23 and jumper field 18 and forms the protector field.

Access to the rear face of a connector is satisfactory and it is possible for an installer to put an arm through the gap between two connectors as far as is needed. It is often required that an installer be able to put an arm through for a distance of up to 12 to 14 inches to reach conductors within the frame and feed conductors to the other side of the frame.

Figure 3:
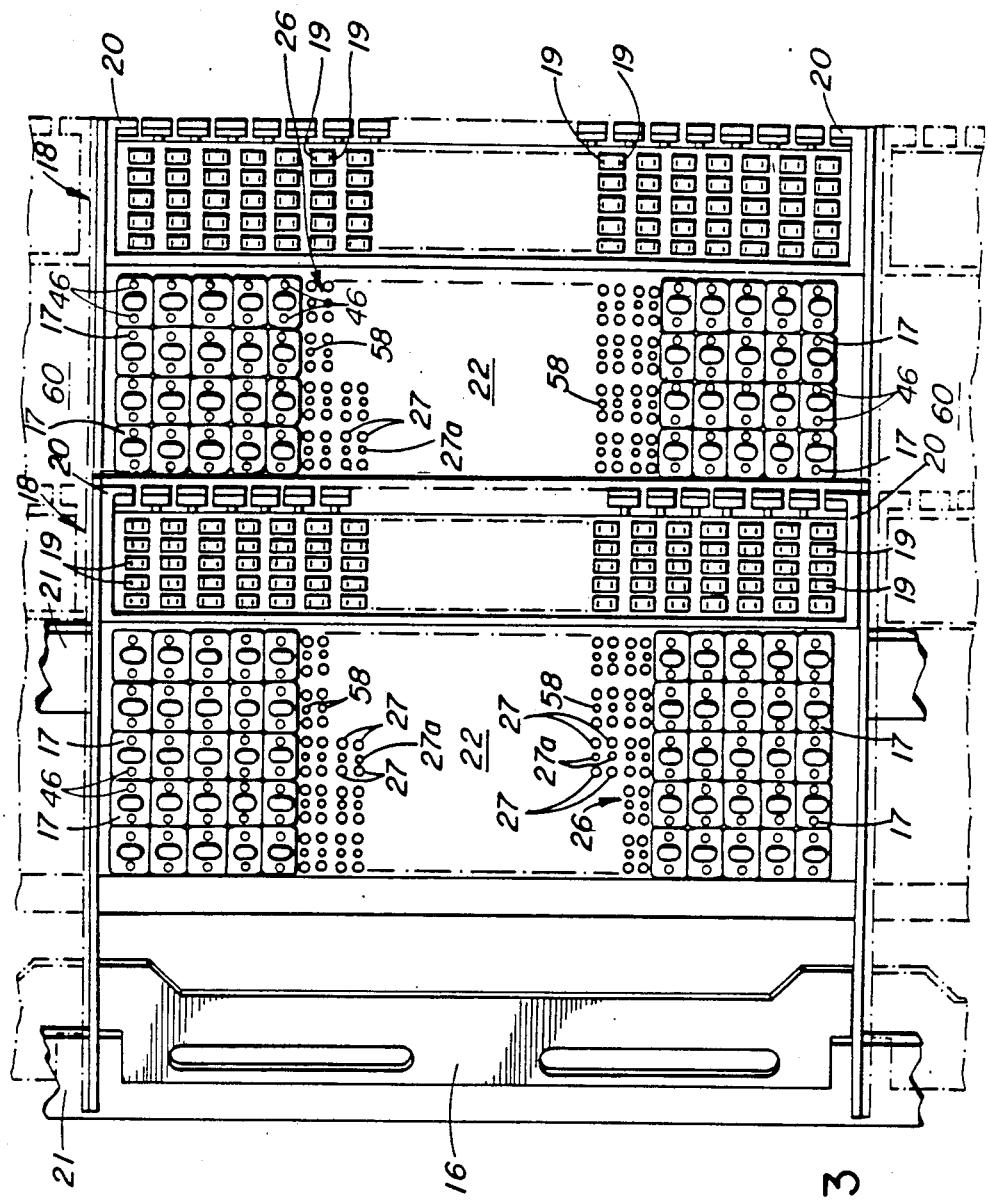
FIG. 3 is a front view of the two connectors in FIG. 2, in the direction of arrow A in FIG. 1.
Figure 4:
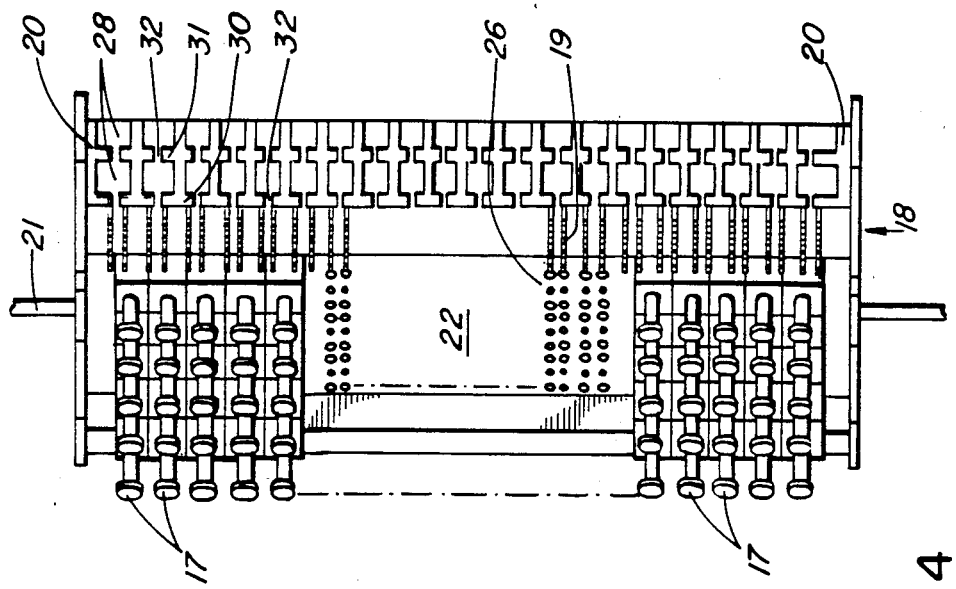
FIG. 4 is a view of the two connectors in FIG. 2, in the direction of arrow B in FIG. 1.
Figure 4:
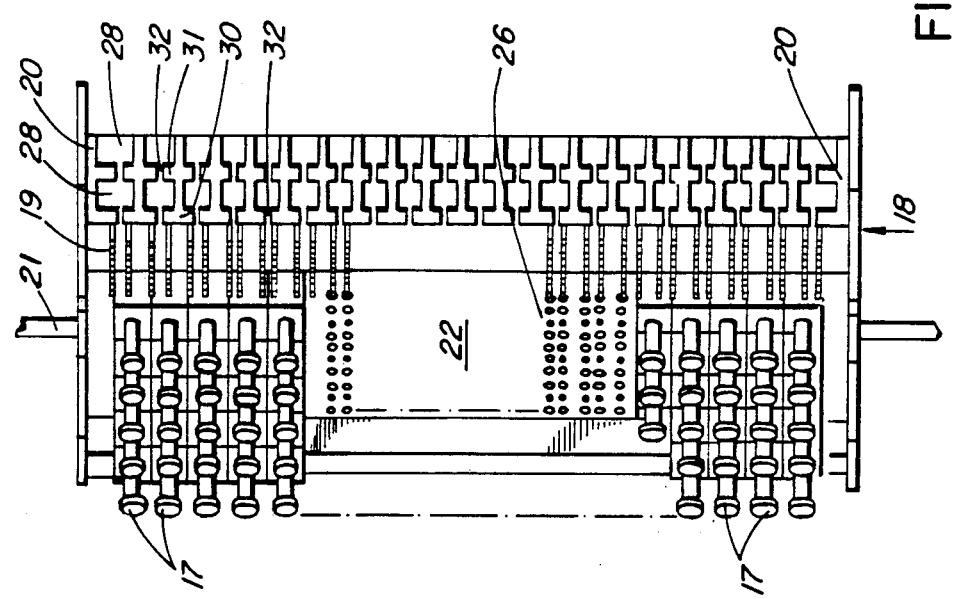
Figure 5:
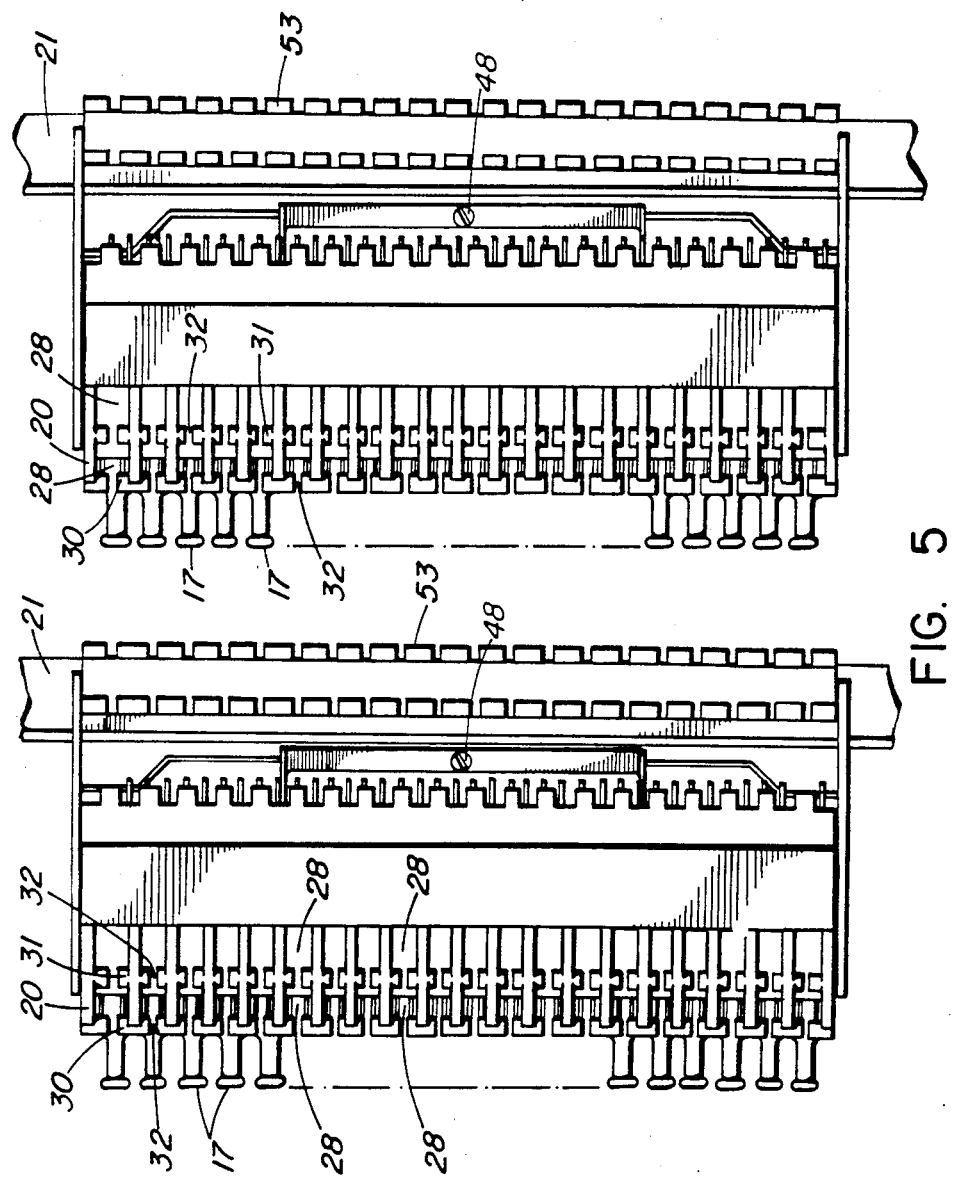
FIG. 5 is a view of the sides of the connectors, in the direction of arrow C in FIG. 1.

FIGS. 3, 4 and 5 illustrate connectors from three different positions. In FIG. 3, the main body portion 22 of a connector is seen, with the protector positions at 26. Each position has five female terminals, four line terminals 27 and a ground terminal 27a, providing one pair of terminals for the Tip conductor or line, one pair of terminals for the Ring conductor or line, and a ground terminal. The positions are arranged in horizontal rows and vertical columns, with five positions in a row and twenty rows, giving connection for 100 pairs. To one side of the main body portion 22 is the jumper field 18. The jumper field is on a forward projecting formation with the terminals 19 arranged in rows of five pairs of terminals. Two rows of pairs are associated with each row of protector positions. It is thus readily ascertainable which pair of jumper terminals is associated with a particular pair of protector terminals. Connections between jumper terminals and protector terminals are made by conductors extending between, and connected to, the rear ends of the various terminals.

The fanning strip 20 extends at the outer edge of the jumper field 18, generally in a plane normal to the plane of the jumper field. As illustrated in FIGS. 4 and 5, a plurality of apertures 28 extend through the fanning strip. In the example, one aperture is associated with each row of protector positions, that is, with each row of pairs of jumper terminals. A thin rib 30 extends down the front edge of the fanning strip and a further thin rib 31 extends down the center of the fanning strip. Narrow slots 32 through the ribs 30 and 31 enable passage of conductors, into the apertures, as jumper conductors are connected between the terminals 19 and fed back behind the connector, generally to another connector or some other item.

Figure 6:
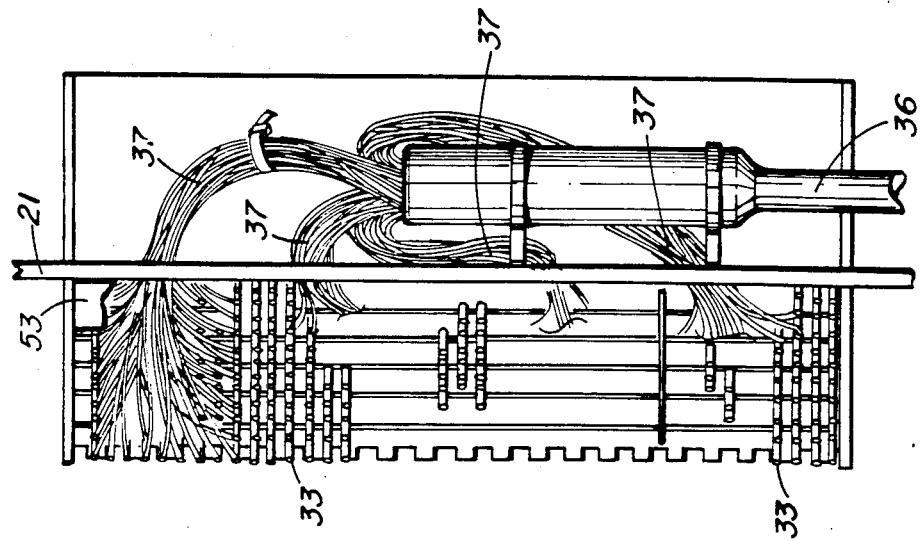
FIG. 6 is a view of the back of the connectors, in the direction of arrow D in FIG. 1.
Figure 6:
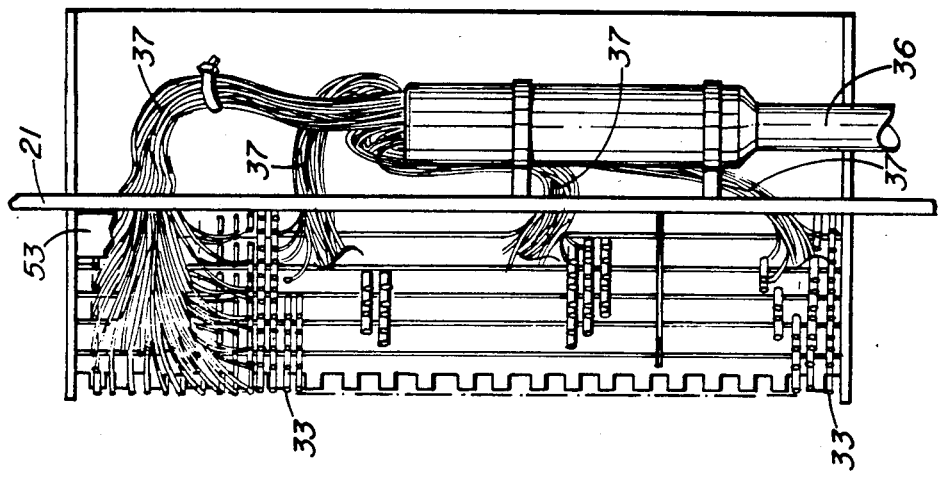

FIG. 6 is a view on the back of two connectors. In the example, a cable 36 enters from the bottom and conductors 37 are connected to the rear ends 33 of the protector line terminals 27. This view indicates the gap between two connectors, permitting access to the rear of a connector and also other items behind the connector.

Figure 7:
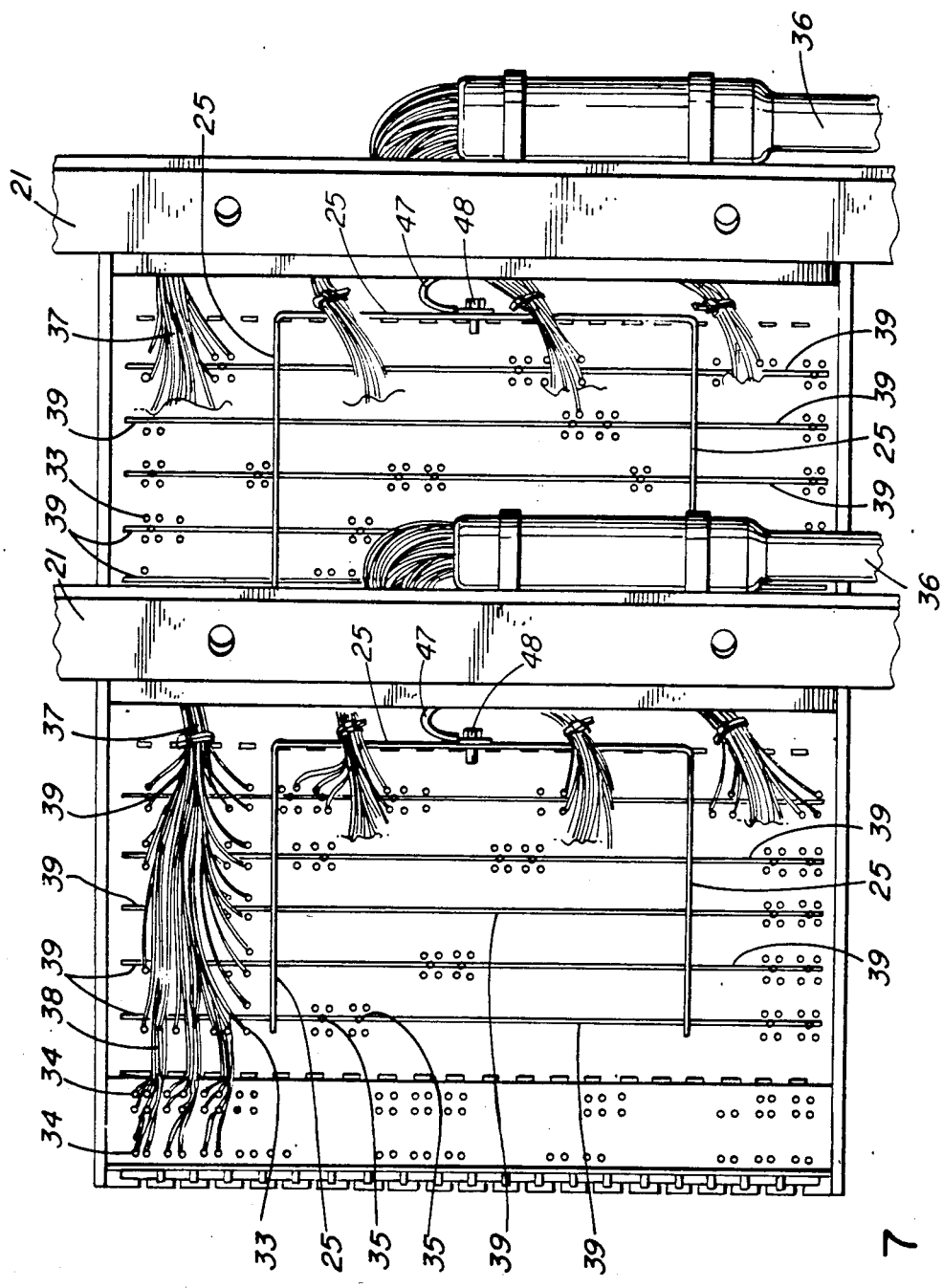
FIG. 7 is a view of the back of a connector, in the direction of arrow E in FIG. 1.

FIG. 7 is a view on the back surface of a connector, showing the connection of conductors 37 to the rear ends 33 of protector line terminals. Also shown are the conductors 38 which connect between the rear ends 33 of protector terminals to the rear ends 34 of the jumper terminals 19. Also seen in FIG. 7 is a ground plane or grid 39 to which are connected the rear ends 35 of the ground terminals 27a. The ground grid is connected to the grounding bracket 25, which in turn can be connected to the frame member 21, making the frame the ground, or the grounding bracket can be separately grounded. The cable shield is also connected to the ground bracket 25 via a tab 47 and a screw 48.

As will be seen in FIG. 7, and appreciated from a consideration of FIGS. 1 and 2, the jumper connections between the rear ends 34 of the terminals 19 in the jumper field are rather exposed to damage when an installer's arm is inserted between connections. One typical such connection is indicated in dotted outline at 50 in FIG. 2. To prevent this, a plastic cover can be snapped in position, one end of the cover extending into the corner 51 of the fanning strip 20 and the other end snapping behind a further fanning strip or member 53 attached to the rear. This plastic cover is indicated in dotted outline at 54 in FIG. 1. The fanning strip 53 assists in keeping the cross-connect conductors from the terminals 19 tidy.

Figure 8:
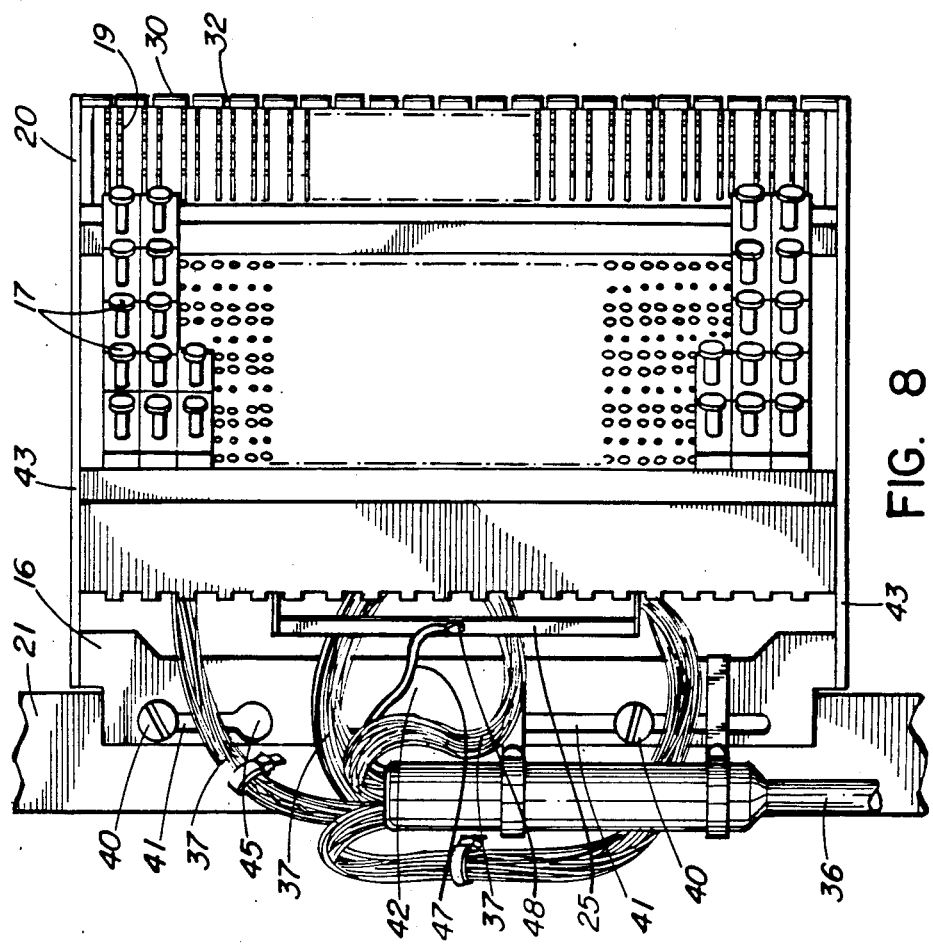
FIG. 8 is a view of the side of a connector, in the direction of arrow F in FIG. 1.
Figure 9:
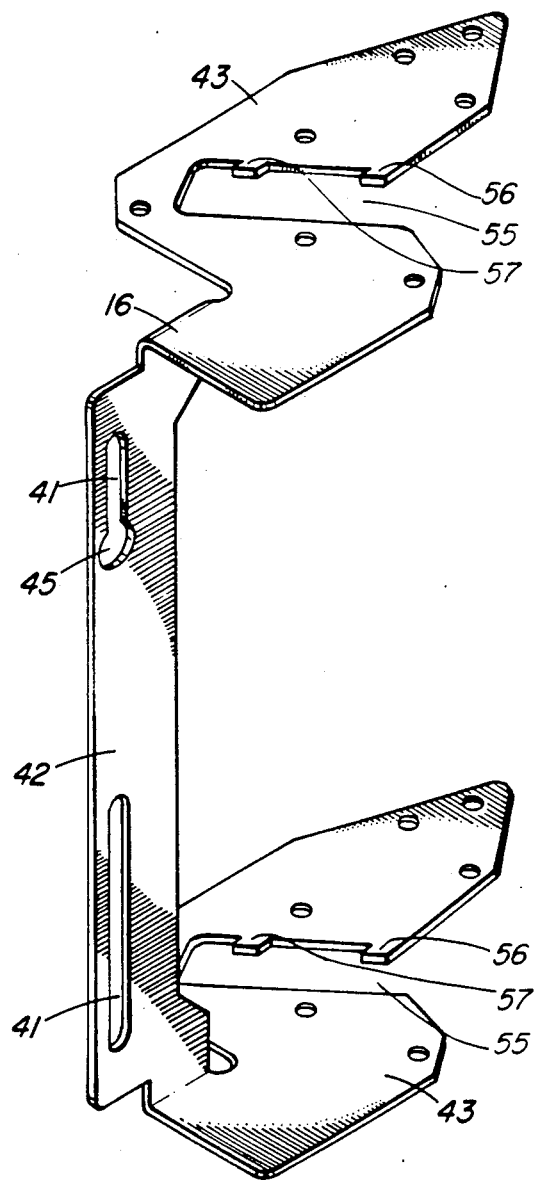
FIG. 9 is a perspective view of a bracket as used to mount a connector on a frame member, as in FIG. 1.

FIG. 8 illustrates the mounting of a connector on a frame member. The mounting bracket 16 is attached to the frame member 21 by means of screws 40 passing through slots 41 in the bracket. For convenience in mounting, in the example, the top slot 41 has a key formation, having an enlargement 45 at the bottom. This enables the bracket 16 to be positioned on an upper screw 40 already on the frame member. The head of the screw passes through the enlargement 45 and then the bracket moved down. Generally, the lowest mounting bracket is attached and then succeeding higher brackets attached. The lower screw 40 is then inserted. As seen in FIGS. 8 and 9, the mounting bracket has a back member 42 in which are formed the slots 41, and two flange members 43, one at the top and one at the bottom. The flange members extend forward from the back member, spaced apart a distance equal to the heights of a connector. Screws pass through the flange members into the connector main body portion 22, the jumper field 18 and the rib 23 to hold them in an assembled position. These screws are seen at 44 in FIG. 1. The bracket 16 is illustrated in perspective in FIG. 9.

The connector is composed of the various separate parts or members, assembled between the top and bottom flange members 43. Thus the main body member or portion 22 is one item or part. It can thus be considered as a basic protector field and can be used as such in other connectors. The cross-connect or jumper field 18 is formed as a separate item, in the example illustrated being an elongate member of generally rectangular cross-section viewed from the top. The fanning strip 20 is shown as molded integrally with the main member, but can be a separate member. This also provides the ability to make the mounting of the jumper field such that it can be pivotted. As an example, considering FIGS. 1 and 2, it will be appreciated that with the front of the jumper field facing somewhat to the left, connection of conductors to the front ends of the terminals 19 could be awkward for a right-handed installer. It is possible to pivot the jumper field, for example through about 30°, to improve access to the front end of the terminals.

It is possible to test the connector by positioning a test shoe on the protector field, with probes on the test shoe alternatively entering test ports 46 on the outer ends of the protectors 17, or into terminals 27 in the protector field if protectors are not inserted. The test shoe has a projection at top and bottom which enters a slot 55 in each of the top and bottom flange members 43. The slots 55 have two projections 56 and 57. When protectors 17 are in position, a latch on the test shoe will engage behind the outer projections 56 holding the shoe in position. When protectors 17 are not in position, the latch on the test shoe engages behind the inner projection 57. This is conventional.

At the protector positions 26, particularly seen in FIG. 3, an extra hole can be provided, at 58. A blocking pin can be inserted into this hole and this will prevent full insertion of a protector, that is, the protector is partially inserted. With a protector only partially inserted, there is no service available to the telephone line connected to that position, but protection is still provided for the cable.

Some slight variation in the angle θ can be made, appreciating that decreasing this angle reduces the clearance "b", and increasing this angle can restrict insertion and removal of protector modules 17. A modification in the form of protector modules can permit variation of θ without unduly restricting access or module removal.

A plurality of connectors are mounted in a vertical array, and further connectors are indicated in chain dotted outline at 60 in FIG. 3.

FIGS. 10 to 18 illustrate another embodiment, or arrangement, of the present invention in which a separate test field is provided, extending down one side of the protector field. In the arrangement the jumper field is rotated through 90° relative to the arrangement in FIGS. 1 to 9. The jumper field faces in a direction at right angles to the facing direction of the protector field and a test field is positioned between the protector field and the jumper field. The test field faces in the same direction as the protector field and is positioned forward of the protector field. In this example, the protector field, which is the main body member, is a basic unit and the test field and jumper field are a separate member. This exemplifies the composite of various separate parts, as described previously. The test field and the jumper field can also each be an individual part or member. To avoid confusion, completely different reference numerals have been used in FIGS. 10 to 18, although some items are the same in both examples.

Figure 10:
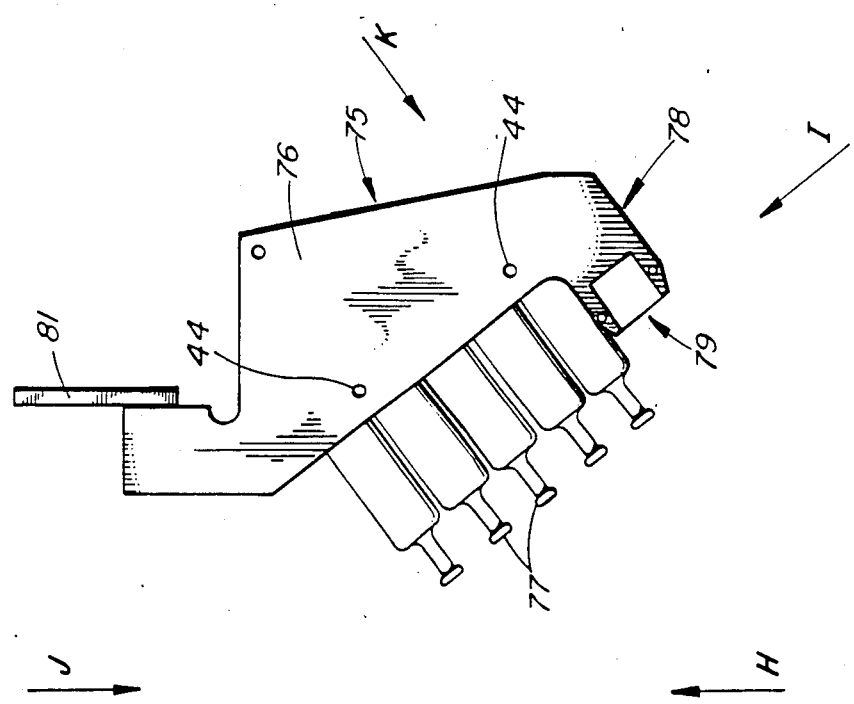
FIG. 10 is a top plan view, similar to that of FIG. 1, illustrating another embodiment of the invention.
Figure 10:
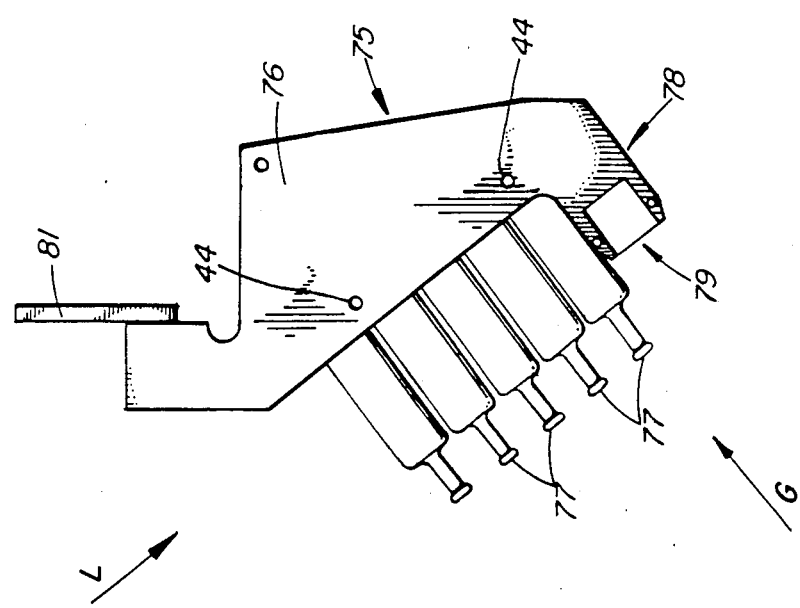
Figure 11:
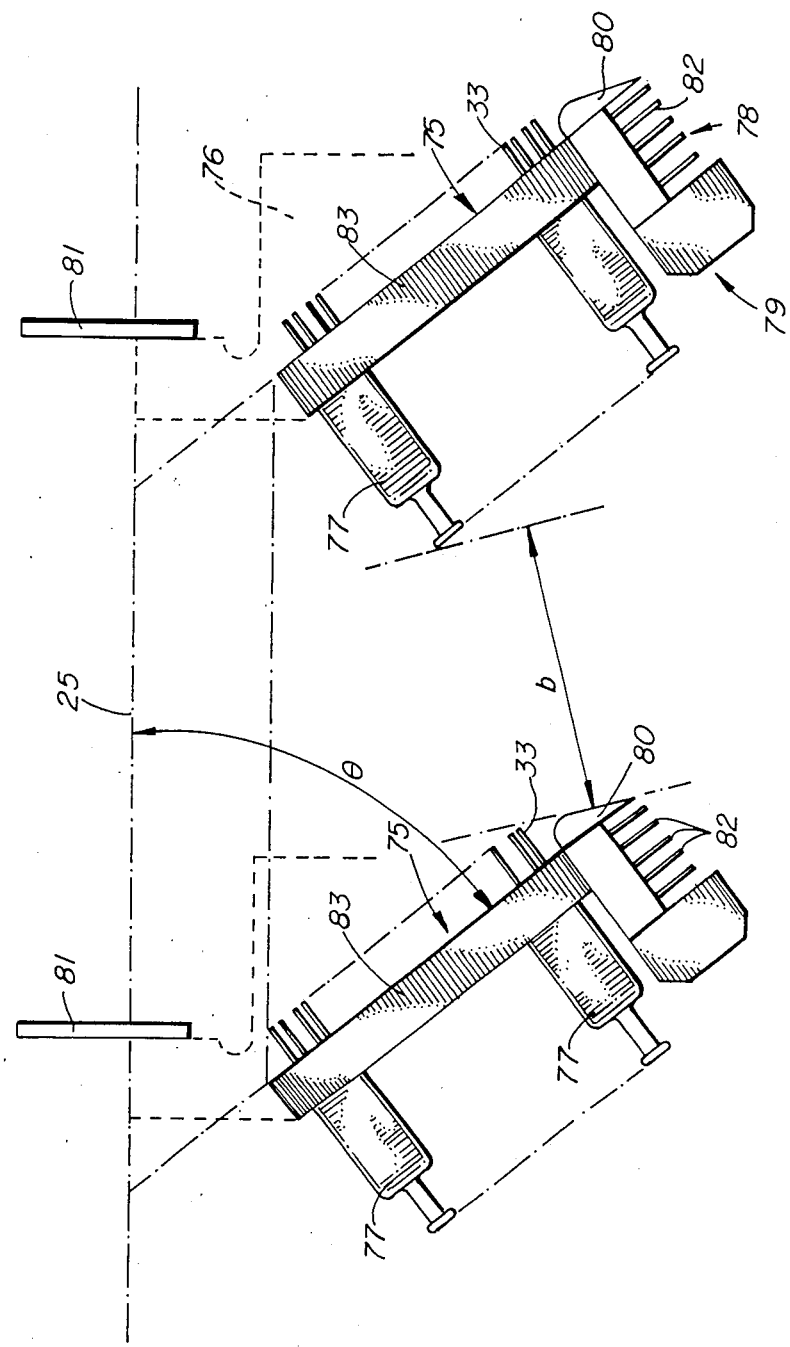
FIG. 11 is a similar view to that of FIG. 2, of the embodiment of FIG. 10.

FIGS. 10 and 11, similar to FIGS. 1 and 2 respectively, are top plan views of two connectors 75 with a separate test field, mounting brackets being indicated at 76 in FIG. 10. Protector modules 77 are positioned in the protector field of the connector, the jumper field being indicated at 78 and the test field at 79. A fanning strip or member 80 extends down the near edge of the jumper field. Frame members on which are mounted the connectors 75 are indicated at 81. The test field 79 extends forward of the protector field, facing in the same direction as the protector field. The test field accepts test connectors most often found in central offices. The jumper field 78 is behind the test field and faces sideways normal to the direction of the test field and protector field. The jumper field has a plurality of pin terminals 82 having inner and outer ends. The angle θ is again about 53° and the dimension "b" is about 3.25 to about 3.5 inches. The other dimensions, "a" to "c" in FIG. 3, remain the same.

The connector 75 has an elongate rectangular main body portion 83, which basically forms the protector field, and the test field and jumper field form a separate unit. The fanning strip 80 is also a separate member. Again, access between connectors is satisfactory, with an installer being able to extend a hand or an arm between the conductors.

Figure 12:
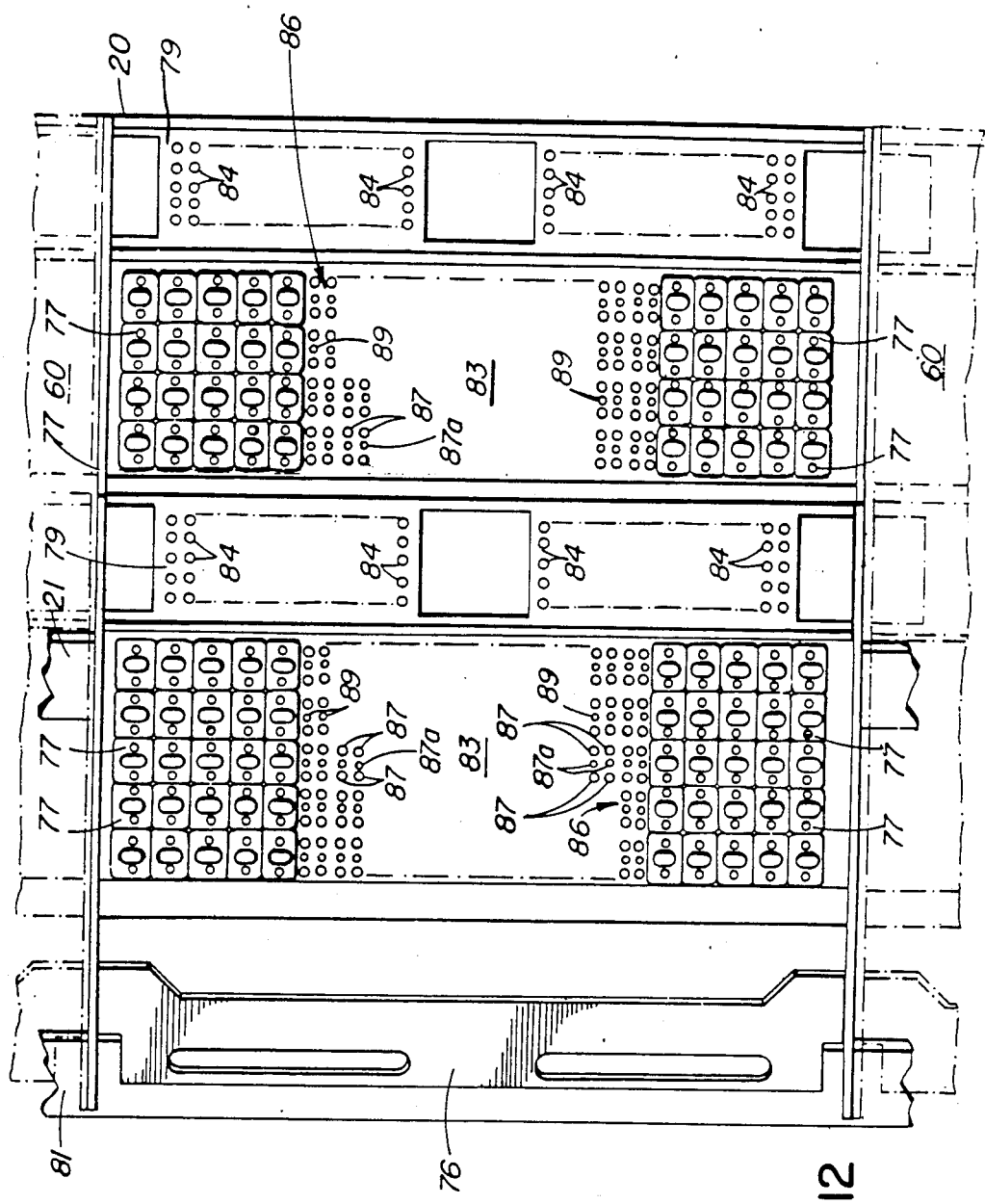
FIG. 12 is a front view in the direction of arrow G in FIG. 10.
Figure 13:
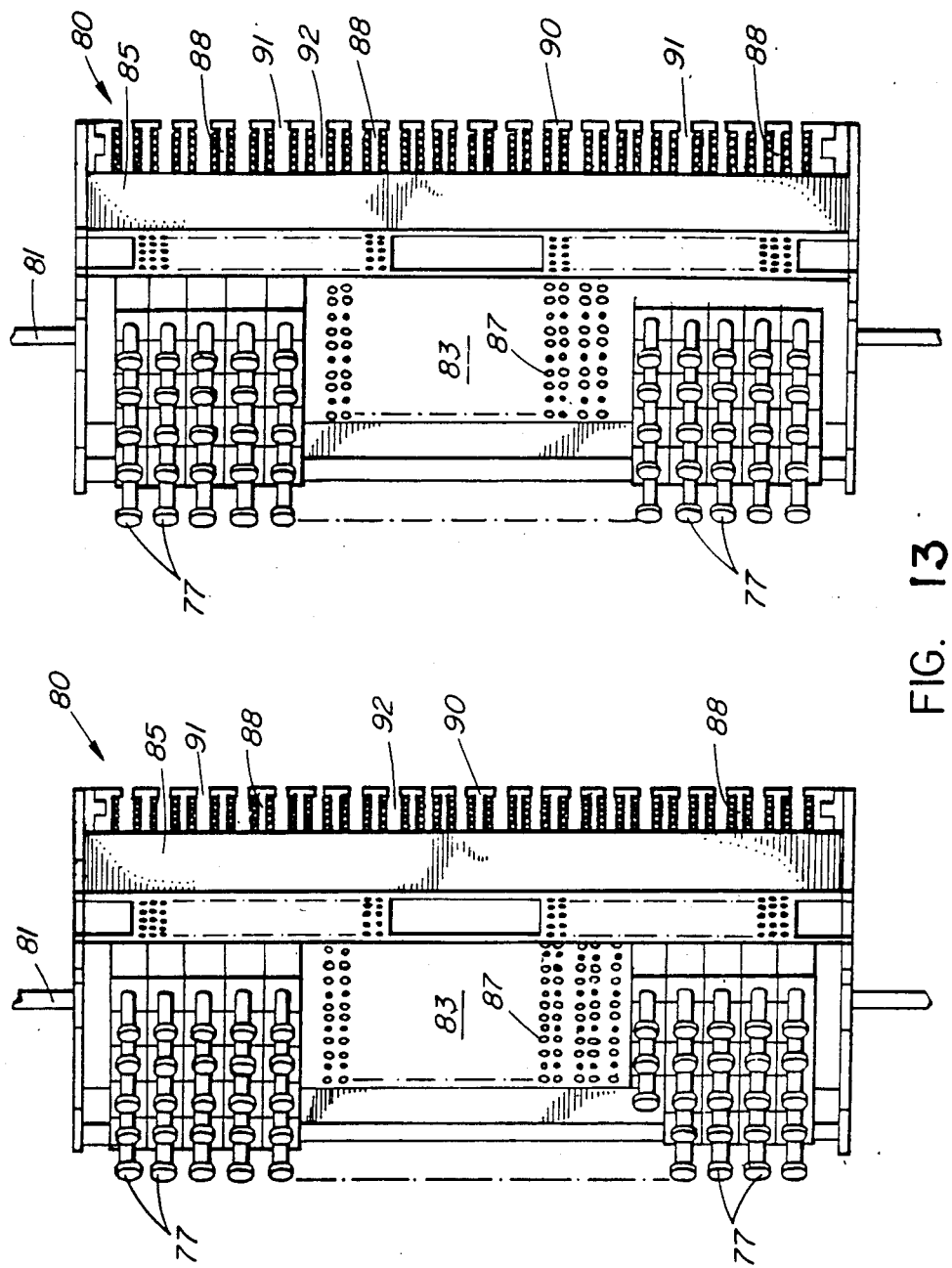
FIGS. 13, 14, 15, 16 and 17 are views in the directions of arrows H, I, J, K and L respectively in FIG. 10.
Figure 14:
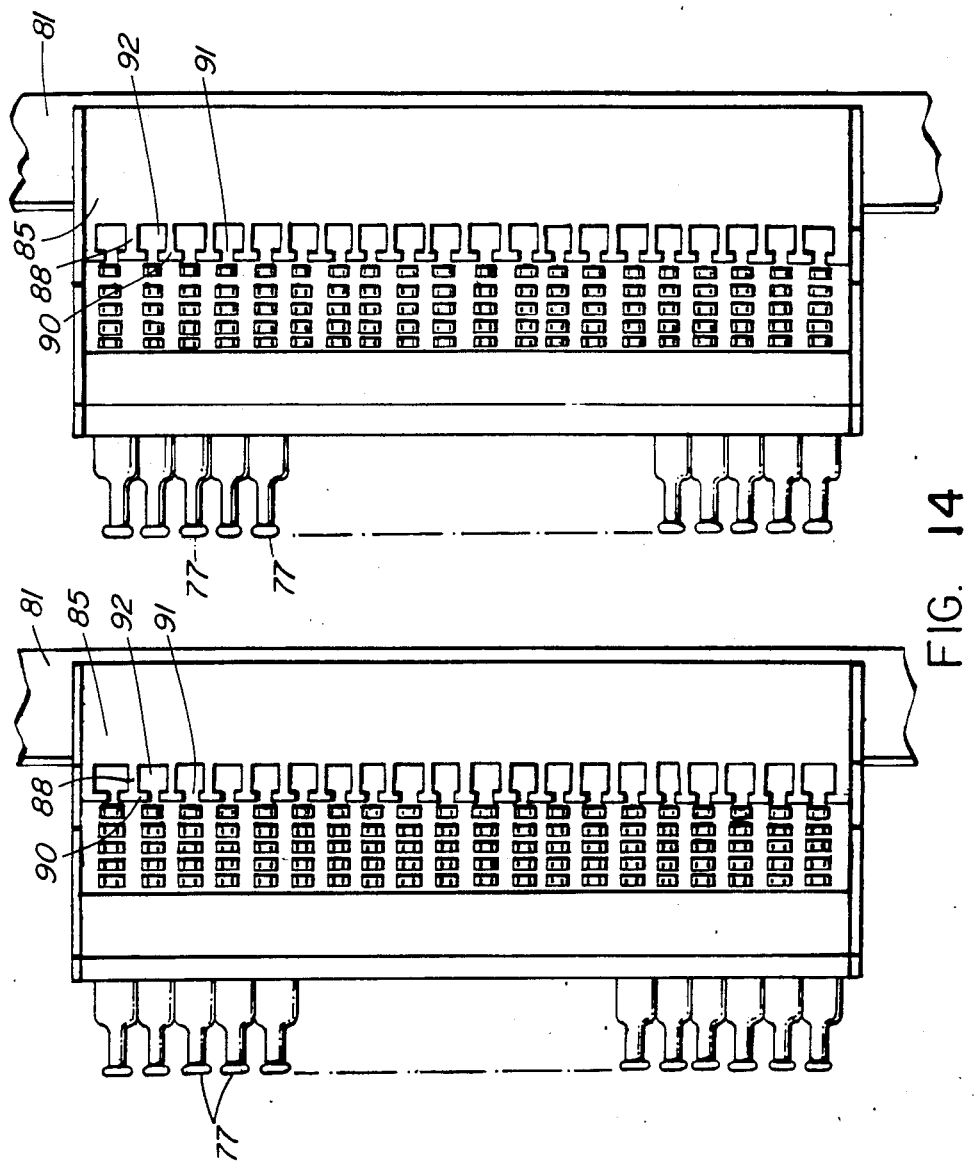

FIGS. 12, 13 and 14 illustrate the connectors of FIGS. 10 and 11 from three different directions. In FIG. 12, the main body portion 83 is seen, with the protector positions at 86. Each position has five female terminals, four line terminals 87 and a ground terminal 87a. These provide a pair of terminals for the Tip conductor or line, a pair of terminals for the Ring conductor or line, and a ground terminal. The positions are arranged in horizontal rows and vertical columns. There are five positions in a row and twenty rows, for 100 pairs. The test field 79, at one side of the main body portion 83, and protector field, has female terminals 84 arranged in horizontal rows, with five terminals 84 in a row. Each row of test terminals is substantially in alignment with a row of protector terminals 87, with two rows of test field terminals 84 aligned with each row of protector positions. Thus it is readily ascertainable which test terminal is associated with a particular line terminal at a protector position. The extra hole 89, for insertion of a blocking pin is also seen.

The protector line terminals 87 are connected to the test field terminals by conductors extending between, and connected to, the rear ends of the terminals. Connections are also made between the rear ends of the test field terminals 84 and the rear ends of the jumper field terminals 82. The jumper field terminals are also in rows, a row of jumper field terminals associated with each row of test field terminals. This also provides easy and quick relationship between the two sets of terminals.

The fanning strip 80 has a back member 85 with a plurality of parallel ribs 88 extending from the back member, a rib between each pair of rows of jumper field terminals. A further rib 90 extends down the outer edges of the ribs 88, with slots 91 through the rib 90. This forms a series of apertures 92 through which conductors can pass from the front ends of the jumper field terminals 82 to some other position on a main frame.

Figure 15:
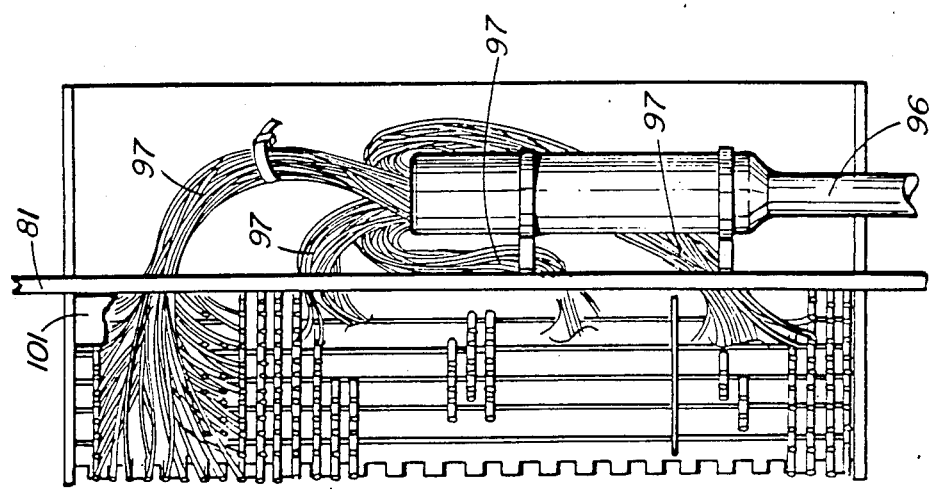
Figure 15:
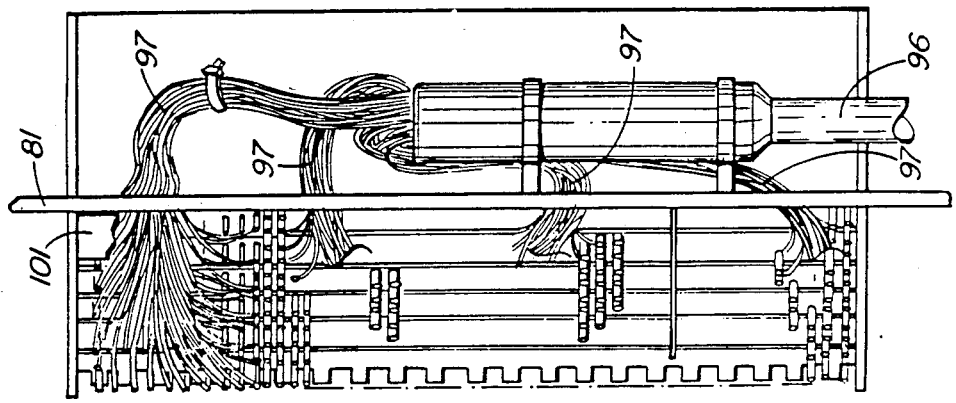
Figure 16:
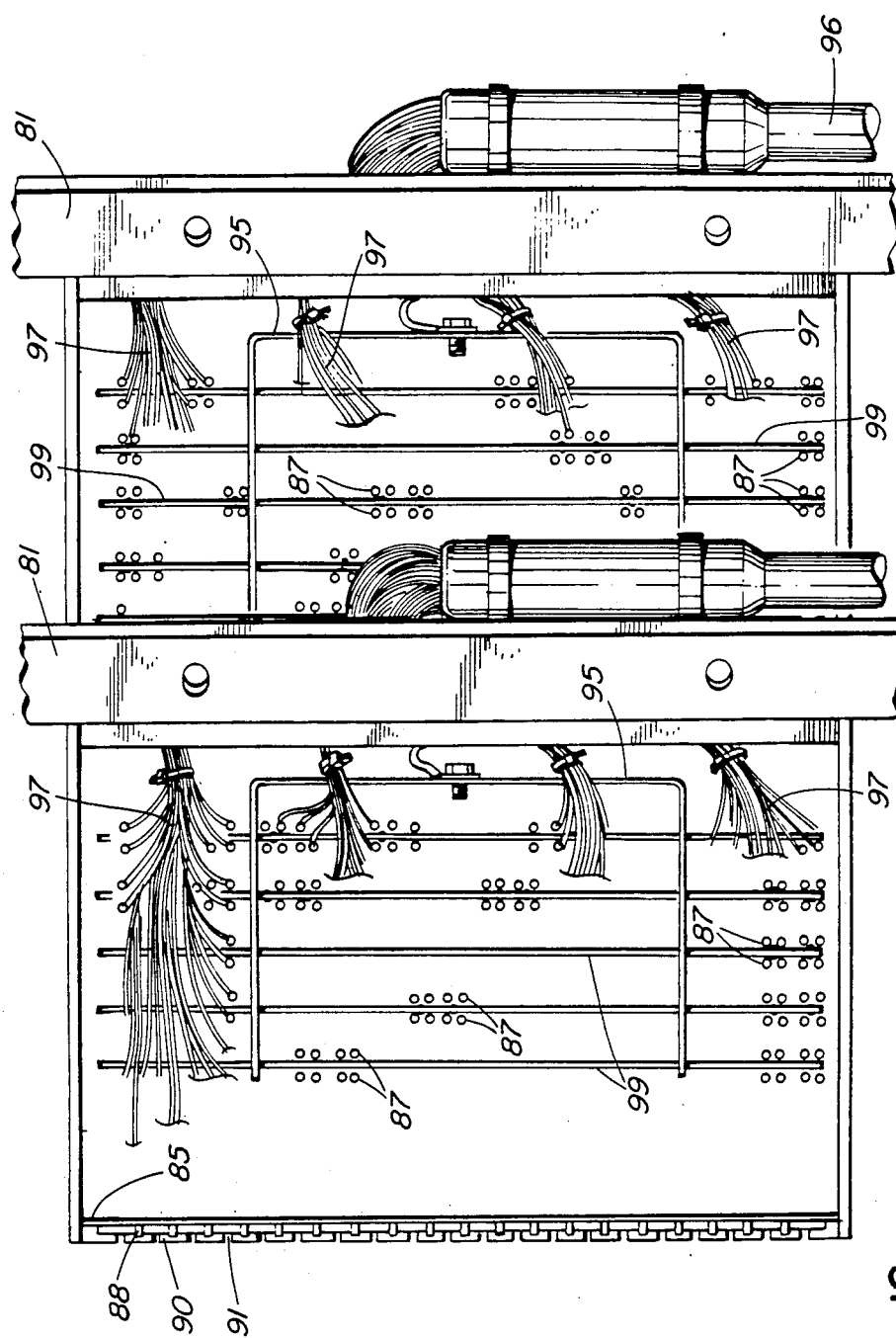
Figure 17:
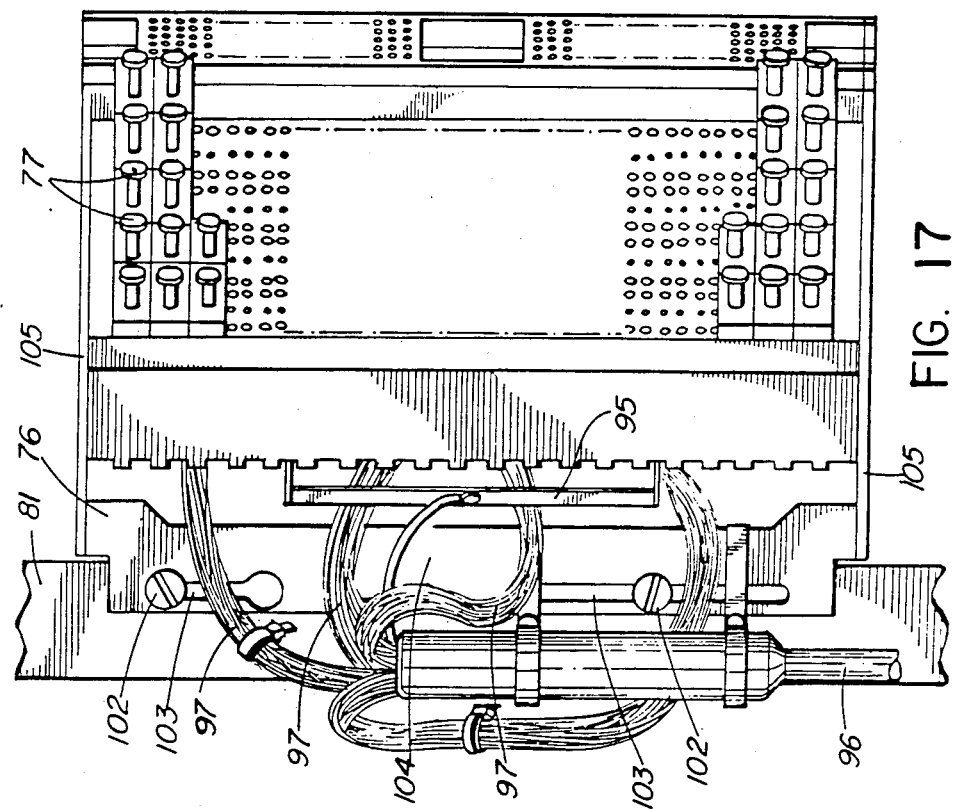

FIG. 15 is a view on the back of two connectors. A cable 96 enters from the bottom and conductors 97 are connected to the rear ends of the protector field line terminals 87. FIG. 16, in addition to showing the connection of conductors 97 to the protector field terminals 87, also shows conductors 98 which connect between the rear ends of the protector field line terminals 87 and the rear ends of the test field terminals 84. Also shown in FIG. 17 is a ground plane or grid 99 which connects to the rear ends of the ground terminals 87a of the protector field. The ground plane or grid is connected to ground bracket 95, which in turn can be connected to the frame member 81, or can be separately grounded. A plastic cover is snapped over the rear of the connector but is not shown in FIG. 15, nor in FIGS. 12 to 14. This cover is shown in FIG. 11 at 100. A further fanning strip 101 is positioned at the rear of each connector, and the cover 100 extends between the two fanning strips 80 and 100 to protect the conductors 97 and conductors 98.

FIG. 17 illustrates the mounting of a connector 75 on a frame member 81. This is the same as is illustrated in FIG. 8, the mounting bracket 76 being attached to the frame member by screws 102 passing through slots 103 in the bracket. For convenience, the top slot has a keyhole formation. This enables the bracket to be positioned on an upper screw already on the frame member.

Figure 18:
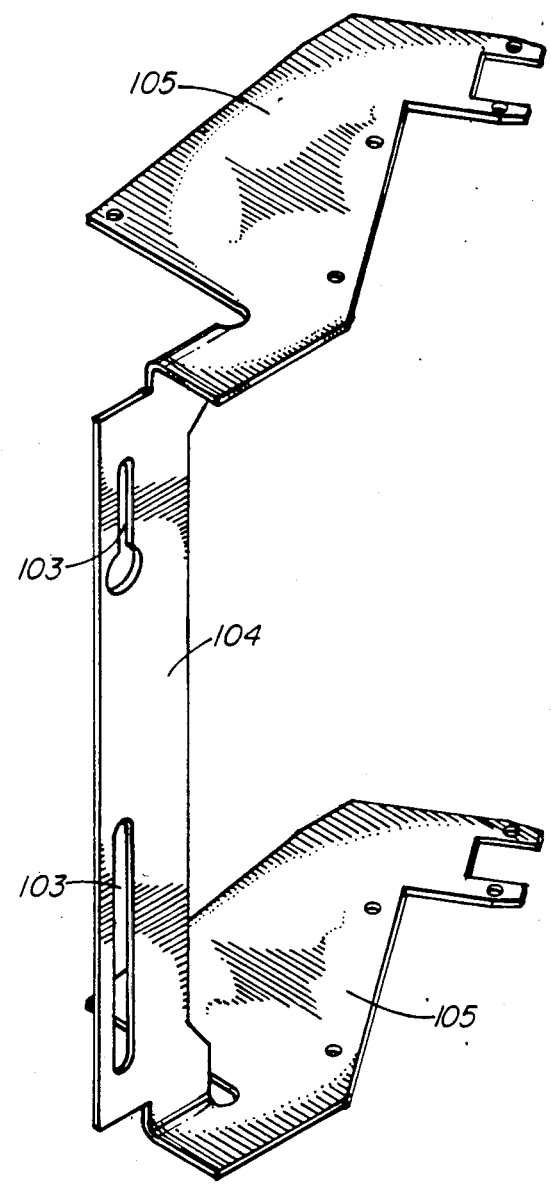
FIG. 18 is a perspective view of the bracket used for mounting a connector as in FIG. 10.

The bracket 76, particularly illustrated in FIG. 18, has a back member 104 and top and bottom flange members 105. The slots 103 are formed in the back member 104. The main body member of the connector, the test field and jumper field, and the two fanning strips are attached between the top and bottom flange members 105 by screws 106 extending through the flange members.

The examples so far described have the connectors mounted at an angle of about 53°, although some variation between about 50° and 56° can be used. This angle gives a high degree of access to the protector modules while also providing good access between connectors for an installer's arm. However, this angle is a compromise and an increase in accessibility for the installer's arm can be obtained by increasing this angle. By so doing, the access to the protector modules is reduced somewhat. Thus, by increasing the angle to about 70°, the access gap is increased to about 4 inches for the installer's arm. Slight variations, for example, from about 65° to 75° will modify this to a limited extent.

Figure 19:
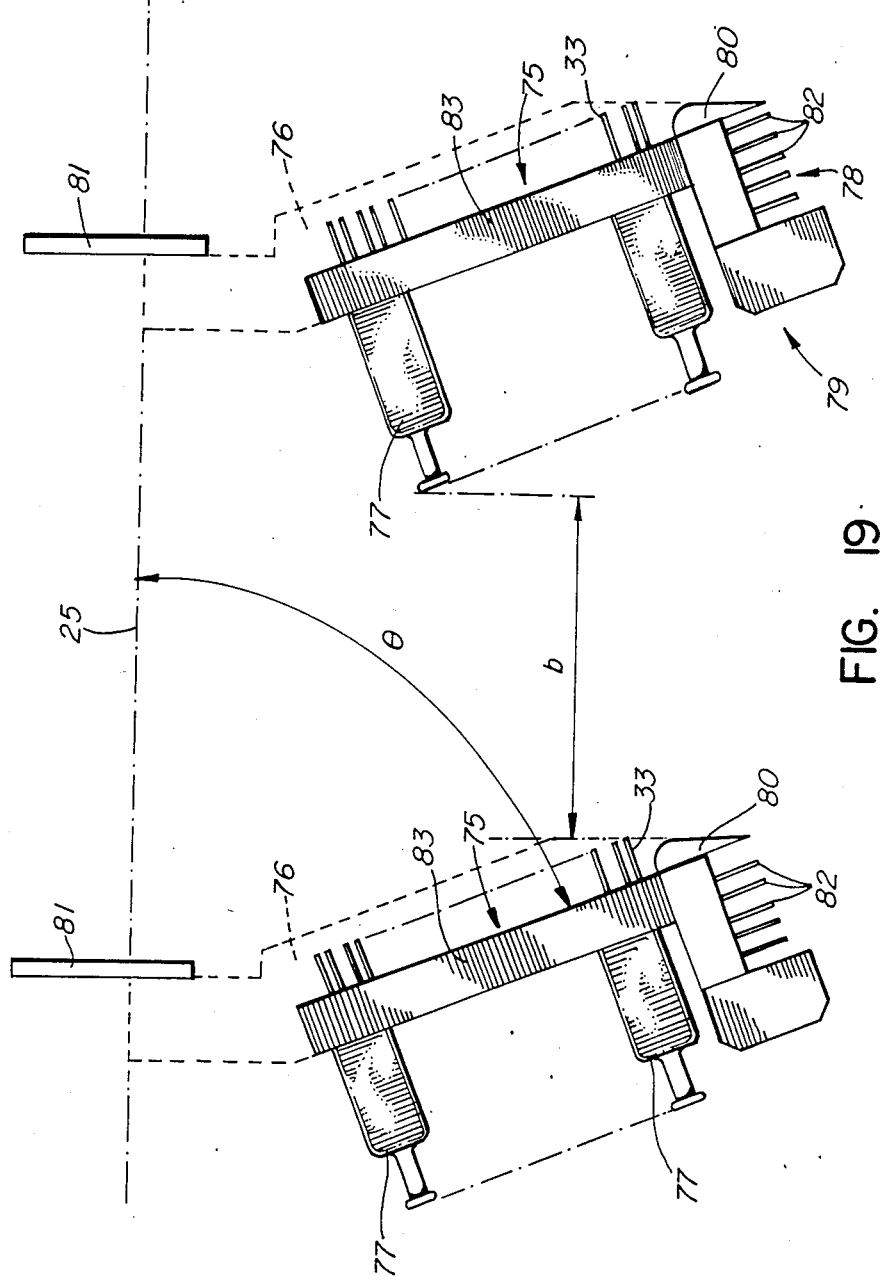
FIG. 19 is a similar view to that of FIG. 11, but with the connectors at an angle of 70°.

This is illustrated in FIG. 19. In FIG. 19, the connectors have been turned slightly more than as in FIG. 11, the angle $\theta$ being about 70°. Dimension "a" remains the same, eight inches, while dimension "b" is increased to about $3\frac{3}{4}$ to about 4 inches. It is still possible to remove a protector by pulling out normal to the base of the connector, but some care is necessary to avoid hitting the rear of the adjacent connector. Once clear of the connector base, the protector module is brought forward from between connectors. Also, all of the protector module outer ends are quite visible.

The same variation in mounting angle can also be provided for the connectors as illustrated in FIG. 2.

The mounting bracket will be of a slightly different form to provide the different mounting angle. It is also conceivable that the mounting bracket be formed so as to provide alternative mounting angles. Such angles need not be limited to about 53° or about 70°, but could be such other angles as may be desired. Certainly any particular angle between about 50° and 75° can be selected, depending upon the particular requirements.

What is claimed is:

1. A connector for main frames in telephone systems, comprising:
   an elongate rectangular body portion of shallow rectangular cross-section viewed along a vertical axis, said body portion including a front face and a plurality of mounting positions on said front face for mounting a plurality of protector modules, said mounting positions being in columns and rows;
   a jumper field positioned at one side of said body portion, said jumper field including a plurality of jumper connecting terminals, said terminals arranged in columns and rows;
   a bracket for mounting said body portion and jumper field on a vertical frame member, said bracket including a back member disposed in a single plane and upper and lower flange members extending forwardly normal to the back member, said body portion and said jumper field extending between and attached to said flange members; means in said back member positioned between said upper and lower flange members for mounting said bracket on said frame member, the arrangement such that said body portion extends in a plane at a predetermined angle relative to the plane of the frame member, said predetermined angle being between about 50 degrees and 75 degrees.

2. A connector as claimed in claim 1, said jumper field including an elongate body member of rectangular cross-section viewed from one end, the body member extending in a plane parallel to said plane of said body portion.

3. A connector as claimed in claim 2, said jumper field extending at a forwardly positioned side of said body portion relative to said back member of said bracket.

4. A connector as claimed in claim 3, including a fanning strip extending along an outer edge of said body member of said jumper field, remote from said body portion.

5. A connector as claimed in claim 3, said jumper field spaced forwardly from said body portion, and a shield member extending between said jumper field and said body portion.

6. A connector as claimed in claim 4, including a further fanning strip extending between and attached to said upper and lower flange members, at a position rearward of said body portion.

7. A connector as claimed in claim 6, including a shield member extending between said fanning strips and enclosing terminals on a rear surface of said jumper field and said body portion.

8. A connector as claimed in claim 1, including a rib extending forward from said body portion, said rib positioned on a side remote from said jumper field.

9. A connector as claimed in claim 1, including a test field at said one side of said body, said test field having a front face extending in a plane parallel to said front face of said body portion, said jumper field positioned at a back face of said test field, said front face of said test field including test terminals extending in columns and rows.

10. A connector as claimed in claim 9, the plane of said front face of said test field being positioned forward of said front face of said body portion.

11. A connector as claimed in claim 9, said jumper field including terminals having front ends and rear ends, said front ends extending in a direction parallel to the plane of said front face of said test field.

12. A connector as claimed in claim 9, including a fanning strip extending along a rear side of said jumper field.

13. A connector as claimed in claim 12, including a further fanning strip extending between said upper and lower flange members of said bracket, at a position rearward of said body portion.

14. A connector as claimed in claim 13, including a shield member extending between said fanning strips, enclosing terminals on a rear surface of said body portion and said rear ends of said terminals in said jumper field.

15. A connector as claimed in claim 1, said predetermined angle being about 51°.

16. A connector as claimed in claim 1, said predetermined angle being about 70°.

17. A main frame connector installation for telephone systems, comprising a plurality of connectors mounted in vertical columns spaced at a constant predetermined pitch, each of said connectors including:
   an elongate rectangular body portion of shallow rectangular cross-section viewed along its vertical axis, said body portion including a plurality of mounting positions for mounting a plurality of protector modules, said mounting positions being in columns and rows;
   a jumper field positioned at one side of said body portion, said jumper field including a plurality of jumper connecting terminals, said terminals arranged in columns and rows;
   a bracket attached to said connector and mounted on a vertical main frame member, said bracket including a back member disposed in a single plane and upper and lower flange members extending forwardly from said back member, said body portion and said jumper field extending between and attached to said flange members, each said body portion extending in a plane at substantially the same predetermined angle relative to the plane of the main frame, said predetermined angle being between about 50 degrees and 75 degrees; to provide a predetermined space between connectors in adjacent columns.

18. An installation as claimed in claim 17, said predetermined pitch being eight inches.

19. An installation as claimed in claim 18, said predetermined space being from about three inches to four inches.

20. An installation as claimed in claim 18, said predetermined angle being about 51°.

21. An installation as claimed in claim 20, said predetermined space being about three and a half inches.

22. An installation as claimed in claim 18, said predetermined angle being about 70°.

23. An installation as claimed in claim 22, said predetermined space being about four inches.

24. An installation as claimed in claim 17, each of said jumper fields having an elongate body member of rectangular cross-section viewed from one end, the body member extending vertically in a plane parallel to said plane of said body portions.

25. An installation as claimed in claim 24, said jumper fields extending at forwardly positioned sides of said body portions.

26. An installation as claimed in claim 25, including a fanning strip extending along a front edge of said body portions.

27. An installation as claimed in claim 25, each said jumper field spaced forward from its related body portion, and a shield member extending between each jumper field and the body portion.

28. An installation as claimed in claim 26, including a further fanning strip extending between and attached to said upper and lower flange members of each bracket, at a position rearward of the body portion.

29. An installation as claimed in claim 28, including a shield member extending between said fanning strips on each connector.

30. An installation as claimed in claim 17, including a rib extending forward from said body portion of each connector, said rib positioned on a side remote from said jumper field.

31. An installation as claimed in claim 17, including a test field at said one side of said body portion of each connector, each said test field having a front face extending in a plane parallel to said front face of said body portion, said jumper field positioned at a back face of said test field, said front face of said test field including test terminals extending in columns and rows.

32. An installation as claimed in claim 31, the plane of said front face of said test field being positioned forward of said front face of said body portion.

33. An installation as claimed in claim 31, said jumper field including terminals having front ends and rear ends, said front ends extending in a direction parallel to the plane of said front face of said test field.

34. An installation as claimed in claim 31, including a fanning strip extending along a rear side of said jumper field.

35. An installation as claimed in claim 34, including a further fanning strip extending between said upper and lower flange members of each of said brackets, at a position rearward of said body portion.

36. An installation as claimed in claim 35, including a shield member extending between the fanning strips on each connector, enclosing terminals on a rear surface of the body portion and said rear ends of said terminals in the jumper field.

37. A method of mounting and servicing connectors for main frames in telephone systems, comprising:
   providing (1) a plurality of elongate rectangular body portions of shallow rectangular cross-section viewed along a vertical axis, said body portions each including a front face and a plurality of mounting positions on said front face for mounting a plurality of protectors modules, said mounting positions being in columns and rows, and (2) a jumper field having a front face and a rear face at one side of each of said body portions, said jumper field including a plurality of jumper connecting terminals in the front face, said terminals arranged in columns and rows and having corresponding connectors on the rear face for receiving conductors;
   mounting said body portion and jumper field on a bracket including a back member and upper and lower flange members extending forwardly normal to the back member by attaching said body portion and said jumper field between said flange members; mounting said back member on a frame member, such that each of said body portions extend in a plane at substantially the same pitch and angle, said angle being between about 50 degrees and 75 degrees relative to the plane of the main frame; connecting conductors to the rear facing connectors; and servicing said conductors and rear facing connectors by reaching between and behind adjacent body portions and brackets without altering the mounting position of the brackets on body positions.

38. The method as claimed in claim 37, including forming said jumper field with an elongate body member of rectangular cross-section viewed from one end, and extending said body member in a plane parallel to the plane of said body portion.

39. The method as claimed in claim 38, including extending said jumper field at a forwardly positioned side of said body portion relative to said back member of said bracket.

40. The method as claimed in claim 39, including extending a fanning strip along an outer edge of said body member of said jumper field, remote from said body portion.

41. The method as claimed in claim 37, including spacing said jumper field forwardly from said body portion and extending a shield member between said jumper field and said body portion.

42. The method as claimed in claim 40, including extending a further fanning strip between and attaching same to said upper and lower flange members, at a position rearward of said body portion.

43. The method as claimed in claim 42, including extending a shield member between said fanning strips and enclosing terminals on a rear surface of said jumper field and said body portion.

44. The method as claimed in claim 37, including extending a rib forward from said body portion, and positioning said rib on a side remote from said jumper field.

45. The method as claimed in claim 37, including positioning a test field at said one side of said body, said test field having a front face extending in a plane parallel to said front face of said body portion, positioning said jumper field at a back face of said test field, said front face of said test field including test terminals extending in columns and rows.

46. The method as claimed in claim 45, including positioning the plane of said front face of said test field forward of said front face of said body portion.

47. The method as claimed in claim 45, wherein said jumper field includes terminals having front ends and rear ends, and extending said front ends in a direction parallel to the plane of said front face of said test field.

48. The method as claimed in claim 45, including extending a fanning strip along a rear side of said jumper field.

49. The method as claimed in claim 48, including extending a further fanning strip between said upper and lower flange members of said bracket, at a position rearward of said body portion.

50. The method as claimed in claim 49, including extending a shield member between said fanning strips, enclosing terminals on a rear surface of said body portion and said rear ends of said terminals in said jumper field.

51. The method as claimed in claim 37, said predetermined angle being about 51 degrees.

52. The method as claimed in claim 37, said predetermined angle being about 70 degrees.

53. An installation as claimed in claim 17 including means in said back member positioned between said upper and lower flange members for mounting said bracket on said main frame member.

* * * * *